(12) United States Patent
Dawson et al.

(10) Patent No.: US 7,382,834 B2
(45) Date of Patent: Jun. 3, 2008

(54) PHASE ROTATION ESTIMATION

(75) Inventors: Joel L. Dawson, Mountain View, CA (US); Sriraman Dakshinamurthy, San Jose, CA (US); Derek K. Shaeffer, Redwood City, CA (US)

(73) Assignee: Beceem Communications Inc., Santa Clara, CA (US)

( * ) Notice: Subject to any disclaimer, the term of this patent is extended or adjusted under 35 U.S.C. 154(b) by 586 days.

(21) Appl. No.: 10/841,290

(22) Filed: May 6, 2004

(65) Prior Publication Data

US 2005/0249321 A1 Nov. 10, 2005

(51) Int. Cl.
*H04L 25/49* (2006.01)
(52) U.S. Cl. ..................................... 375/296
(58) Field of Classification Search ........ 375/295–298, 375/376; 455/63.1, 114.2, 114.3; 341/143, 341/163, 164
See application file for complete search history.

(56) References Cited

U.S. PATENT DOCUMENTS

| | | | |
|---|---|---|---|
| 4,816,775 A | | 3/1989 | Ryan |
| 5,010,405 A | * | 4/1991 | Schreiber et al. ......... 348/432.1 |
| 5,933,456 A | * | 8/1999 | Oomen et al. .............. 375/295 |
| 6,313,703 B1 | | 11/2001 | Wright et al. |
| 6,351,677 B1 | | 2/2002 | Leyonhjelm et al. |
| 6,535,562 B1 | * | 3/2003 | Mohseni et al. ............ 375/296 |
| 6,873,281 B1 | * | 3/2005 | Esterberg et al. .......... 341/163 |
| 7,057,540 B2 | * | 6/2006 | Muhammad et al. ....... 341/143 |

FOREIGN PATENT DOCUMENTS

| | | |
|---|---|---|
| EP | 1 168 597 A | 1/2002 |
| EP | 1 361 655 A | 11/2003 |

OTHER PUBLICATIONS

Ohishi et al., "Cartesian Feedback Amplifier with Soft Landing," in Proc. 3rd IEEE Int. Symp. Personal, Indoor, and Wireless Communications, 1992, pp. 402-406.

Faulkner et al., "Performance of automatic phase adjustment using supply current minimization in a RF feedback lineariser," in Proc. 8th IEEE Int. Symp. Personal, Indoor, and Mobile Radio Communications, 1997, pp. 858-862.

Dawson et al., "Automatic Phase Alignment for a Fully Integrated Cartesian Feedback Power Amplfier System," IEEE Journal of Solid-State Circuits, vol. 38, pp. 2269-2279, Dec. 2003.

* cited by examiner

*Primary Examiner*—Khanh C. Tran

(57) ABSTRACT

Apparatus, systems, and methods implementing techniques for estimating a relative rotation between a first complex signal and a second complex signal. The first complex signal is quantized to produce a quantized signal, and the quantized signal and an additional signal are combined, where the additional signal corresponds to the second complex signal. An estimate of a relative rotation between the first complex signal and the second complex signal is generated in accordance with the combined signal.

61 Claims, 3 Drawing Sheets

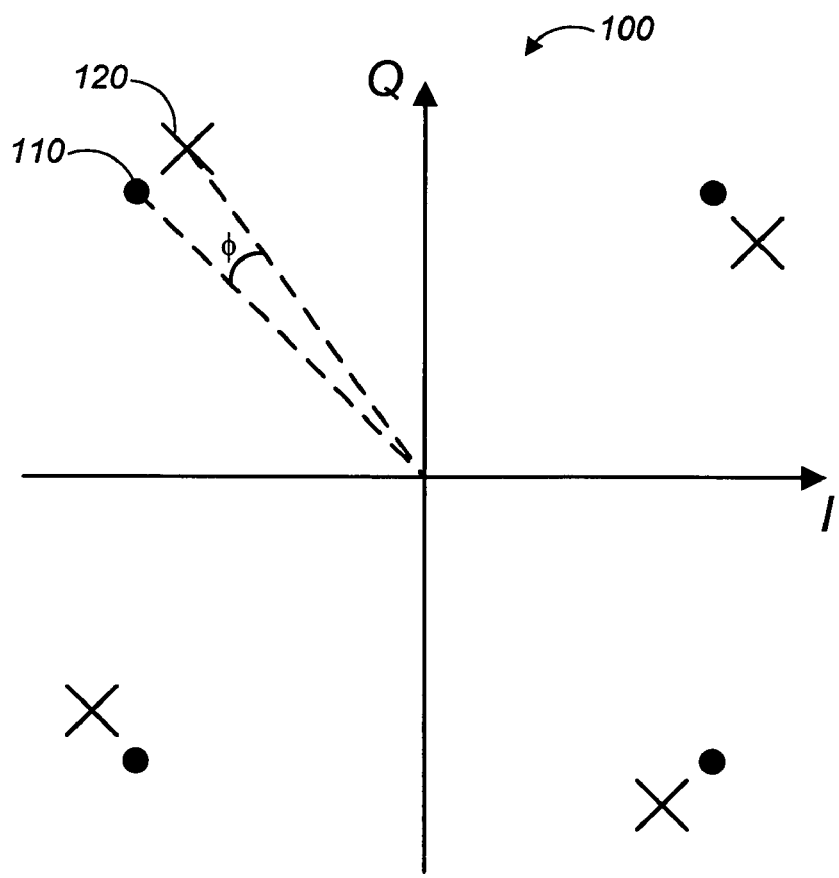
FIG._1A
PRIOR ART
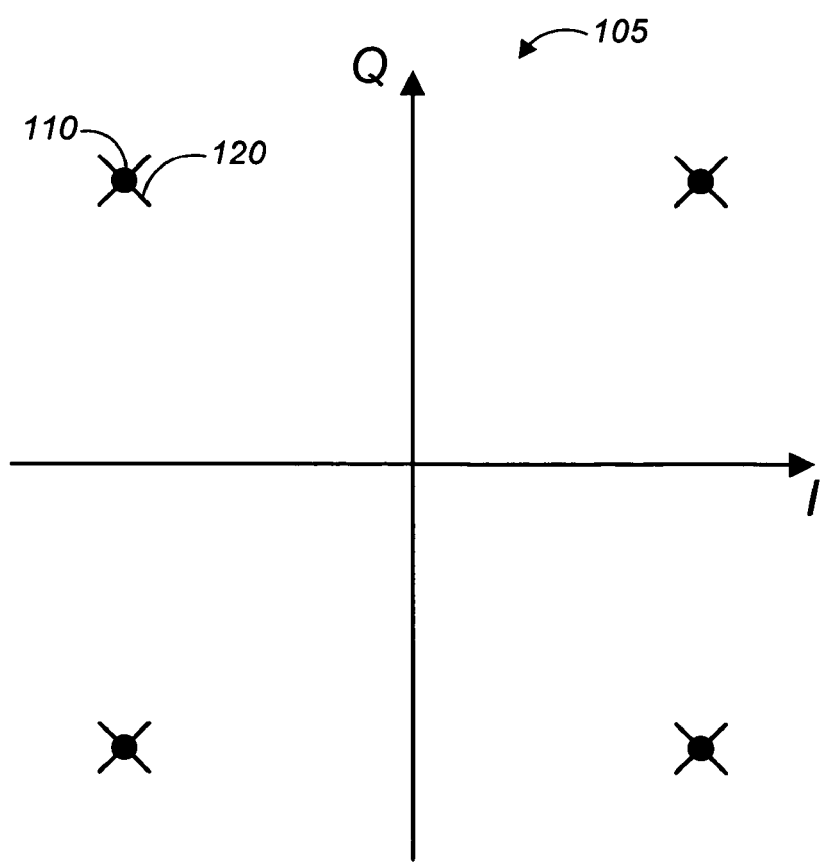
FIG._1B
PRIOR ART

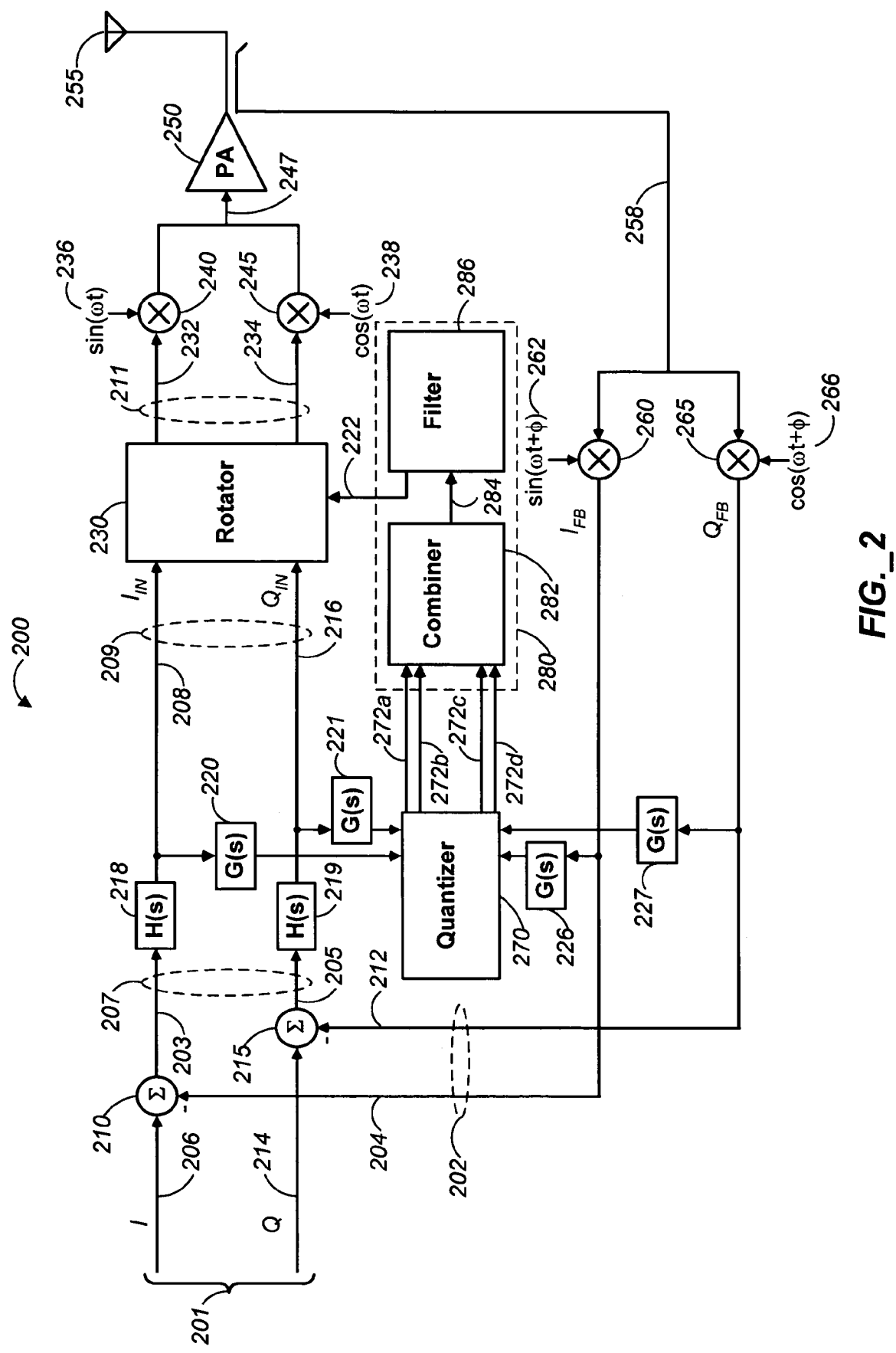
FIG._2

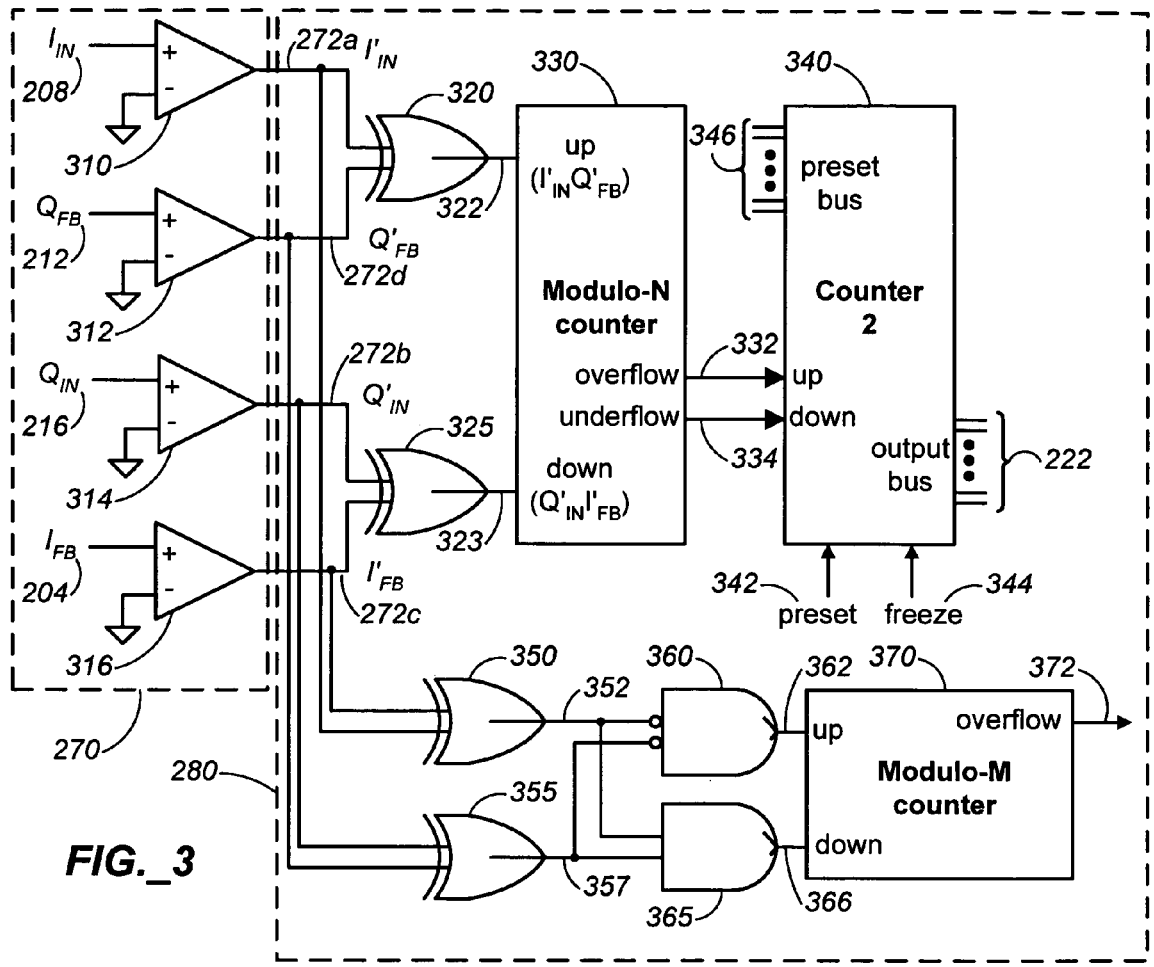
FIG._3
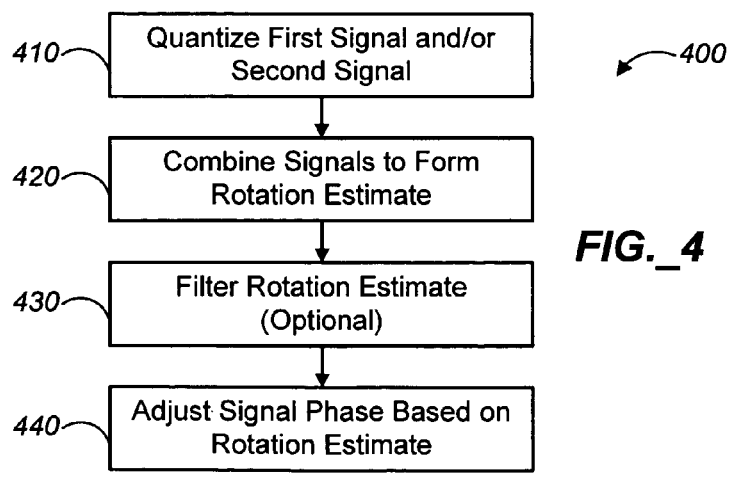
FIG._4

PHASE ROTATION ESTIMATION

BACKGROUND

The following disclosure relates to electrical circuits and signal processing.

Aligning the phases of two or more signals in a communications system can be useful. The signals can be information signals at multiple points in a signal path. For example, in a communications system that uses feedback, the phase of a feedback signal may need to be aligned with the phase of a forward path signal for the system to operate correctly or efficiently.

A complex signal (represented, for example, by an in-phase component and a quadrature component) can be used to transmit information using symbols that are specific combinations of the components of the complex signal. For example, an in-phase (I) and quadrature (Q) representation of a complex signal can have four symbols, corresponding to the following combinations of the amplitudes of (I,Q): (1,1); (1,−1); (−1,1); and (−1,−1). FIG. 1A shows a plot 100 of the in-phase and quadrature components of two complex signals. Two constellations of symbols, each constellation corresponding to a complex signal, are shown. Each of the constellations includes four symbols that represent the symbols that can be transmitted by the corresponding complex signal. One constellation is represented by four circles (e.g., circle 110), and the other constellation is represented by four crosses (e.g., cross 120). The constellation represented by the crosses is rotated relative to the constellation represented by the circles by an angle of $\phi$, indicating that the corresponding complex signals are rotated relative to each other.

A relative rotation between two complex signal constellations can have several causes. In a typical scenario, a first (I,Q) signal pair is used to modulate a radio-frequency (RF) carrier. The modulated carrier, an RF signal, undergoes analog processing steps, after which the modulated carrier is demodulated. A second (I,Q) signal pair results from the demodulation. Any difference in phase between the modulated carrier before the processing steps and the modulated carrier after the processing steps is manifested as a relative rotation between the baseband constellations corresponding to the first and second (I,Q) signal pairs.

FIG. 1B shows a plot 105 of the in-phase and quadrature components of the two complex signals from FIG. 1A where the phase of the complex signal with the constellation represented by the crosses (e.g., cross 120) has been rotated by −$\phi$ to align the two constellations and therefore align the two complex signals. Aligning two complex signals is equivalent to making the relative rotation between the signals substantially zero.

An example of a component in a communications system that uses feedback is a Cartesian feedback transmitter. In a Cartesian feedback transmitter, a complex feedback signal is subtracted from a complex input signal to produce a complex error signal. The complex error signal is amplified and filtered to produce an intermediate signal, which is then modulated for transmission. The modulated signal is also demodulated in the transmitter to produce the complex feedback signal. Using Cartesian feedback in a transmitter improves the linearity of the transmitter, but properly aligning the phases of the complex intermediate signal and the complex feedback signal is important.

The complex feedback signal typically has a different phase than the complex intermediate signal because of, for example, delays in the RF signal path or a phase difference between the oscillator signal used during modulation and the oscillator signal used during demodulation. A change in output power level or a change in carrier frequency can also cause a relative rotation between the complex intermediate signal and the complex feedback signal. The phase of the complex intermediate signal can be adjusted (e.g., by using a rotator circuit) to align the complex intermediate signal and the feedback signal. The adjustment of the phase of the complex intermediate signal can be controlled based on, for example, an estimate of the relative rotation between the complex intermediate signal and the complex feedback signal.

One technique that can be used to estimate the phase difference between the complex intermediate signal and the complex feedback signal is to multiply the in-phase component of the intermediate signal ($I_{IN}$) by the quadrature component of the feedback signal ($Q_{FB}$) and to multiply the quadrature component of the intermediate signal ($Q_{IN}$) by the in-phase component of the feedback signal ($I_{FB}$), all multiplication being done in the analog domain. The second product ($Q_{IN} I_{FB}$) is then subtracted from the first product ($I_{IN} Q_{FB}$), and the result is integrated. A rotator circuit uses the integrated result to rotate the phase of the intermediate signal with respect to the feedback signal.

In practice, use of the $I_{IN} Q_{FB} - Q_{IN} I_{FB}$ phase alignment technique described above may require analog multipliers capable of handling signals that have a very large dynamic range. The analog multipliers can be difficult to design, and may require an unacceptable amount of power and/or complexity to implement.

SUMMARY

In one aspect, a method for estimating a relative rotation between a first complex signal and a second complex signal is presented, in which the first complex signal is quantized to produce a quantized signal. The quantized signal and an additional signal are combined, where the additional signal corresponds to the second complex signal. An estimate of a relative rotation between the first complex signal and the second complex signal is generated in accordance with the combined signal.

In another aspect, a rotation-estimation circuit is presented, which includes a quantizer that receives a first complex signal and produces a quantized signal. A combiner receives the quantized signal and an additional signal and produces a combined signal, where the additional signal corresponds to a second complex signal. An estimate generator receives the combined signal and produces an estimate of a relative rotation between the first complex signal and the second complex signal.

In yet another aspect, a wireless transmitter is presented that transmits a complex input signal. The wireless transmitter includes a rotator that receives a first complex signal and adjusts a phase of the first complex signal relative to a phase of a second complex signal to produce an adjusted signal. The rotator adjusts the phase of the first complex signal responsive to an estimate of a relative rotation between the first complex signal and the second complex signal. The wireless transmitter also includes a rotation-estimation circuit, which includes a quantizer operable to receive the first complex signal and produce a quantized signal. A combiner receives the quantized signal and an additional signal and produces a combined signal, where the additional signal corresponds to the second complex signal. An estimate generator receives the combined signal and produces the estimate of the relative rotation between the first complex signal and the second complex signal.

Particular implementations may include one or more of the following features. The second complex signal can be quantized to produce the additional signal. The additional signal can be the second complex signal. Generating an estimate can include filtering the combined signal, which can include digital filtering of the combined signal and/or analog filtering of the combined signal. Digital filtering can include integrating, filtering synchronously, and/or filtering asynchronously. Filtering the combined signal can include low-pass filtering the combined signal, which can include integrating. Filtering can also include setting a filter to a predetermined state.

The first complex signal and the second complex signal can be substantially identical except for the relative rotation. The first complex signal can include a first in-phase component and a first quadrature component, and the second complex signal can include a second in-phase component and a second quadrature component. Quantizing the first complex signal can include quantizing the first in-phase component and the first quadrature component, and combining can include combining multiplicative products of any of the quantized first in-phase component, the quantized first quadrature component, the second in-phase component, and the second quadrature component. The second in-phase component and the second quadrature component can be quantized, and combining can include combining multiplicative products of any of the quantized first in-phase component, the quantized first quadrature component, the quantized second in-phase component, and the quantized second quadrature component. Combining can include summing and/or differencing.

Quantizing can include multi-bit quantizing and/or one-bit quantizing. The first complex signal can include a first in-phase component and a first quadrature component, and one-bit quantizing can include quantizing the first in-phase component and/or the first quadrature component using one bit per component. The first complex signal and/or the second complex signal can be a continuous-time signal. The first complex signal and/or the second complex signal can be a discrete-time signal. Either of the first complex signal and the second complex signal can be sampled in time.

At least one of the first complex signal and the second complex signal can be rotated in accordance with the estimate of the relative rotation between the first complex signal and the second complex signal. Rotating can include shifting the phase of the first complex signal and/or the second complex signal. The first complex signal can include a first in-phase component and a first quadrature component, the second complex signal can include a second in-phase component and a second quadrature component, and rotating can include producing a weighted sum of any of the first in-phase component, the first quadrature component, the second in-phase component, and the second quadrature component. The estimate of the relative rotation between the first complex signal and the second complex signal can be quantized. Combining can include a digital combination and/or an analog combination. Either of the first complex signal and the second complex signal can be filtered. Filtering can include high-pass, low-pass, and/or band-pass filtering.

The invention can be implemented to realize one or more of the following advantages. An estimate of relative rotation between complex signals can be provided in a communications system whose design, manufacture, and operation are simplified. The rotation estimate can be provided for signals having a wide range of amplitudes without special signal processing steps. The rotation estimate can be produced using less power and without limiting the dynamic range of a transmitter.

These general and specific aspects may be implemented using an apparatus, a method, a system, or any combination of apparatus, methods, and systems.

The details of one or more implementations are set forth in the accompanying drawings and the description below. Other features and advantages will become apparent from the description, the drawings, and the claims.

BRIEF DESCRIPTION OF THE DRAWINGS

FIG. 1A is a plot of symbols of misaligned complex signals.
FIG. 1B is a plot of symbols of aligned complex signals.
FIG. 2 is a diagram of a Cartesian feedback transmitter.
FIG. 3 is a schematic of a quantizer and a rotation estimator.
FIG. 4 is a flowchart of a process for estimating and adjusting a relative rotation between complex signals.

Like reference numbers and designations in the various drawings indicate like elements.

DETAILED DESCRIPTION

FIG. 2 shows a Cartesian feedback transmitter 200, hereafter referred to as transmitter 200. Transmitter 200 receives a complex input signal 201 from, for example, a baseband circuit and subtracts a complex feedback signal 202 from input signal 201. A summer 210 subtracts an in-phase component 204 of feedback signal 202 from an in-phase component 206 of input signal 201 to produce an in-phase component 203 of a complex error signal 207. A summer 215 subtracts a quadrature component 212 of feedback signal 202 from a quadrature component 214 of input signal 201 to produce a quadrature component 205 of error signal 207. Filter 218 filters in-phase component 203 of error signal 207 to produce an in-phase component 208 of a complex intermediate signal 209 and filter 219 filters quadrature component 205 of error signal 207 to produce a quadrature component 216 of intermediate signal 209. Filters 218 and 219 provide a gain to error signal 207. Any of input signal 201, feedback signal 202, error signal 207, and intermediate signal 209 can be a continuous-time signal or a discrete-time signal.

Rotator 230 receives in-phase component 208 and quadrature component 216 of intermediate signal 209 and rotates intermediate signal 209 responsive to a rotation signal 222 representing the relative rotation between feedback signal 202 and intermediate signal 209 to produce a complex rotated signal 211. Rotator 230 can rotate the phase of intermediate signal 209 by computing an in-phase component 232 of rotated signal 211 and a quadrature component 234 of rotated signal 211 as weighted sums of in-phase component 208 and quadrature component 216 of intermediate signal 209. In one implementation, rotator 230 rotates the phase of intermediate signal 209 by shifting the phase of first local-oscillator signals 236 and 238 relative to the phase of second local-oscillator signals 262 and 266. In another implementation, rotator 230 rotates the phase of feedback signal 202 by shifting the phase of second local-oscillator signals 262 and 266 relative to the phase of first local-oscillator signals 236 and 238. In one implementation, rotator 230 is placed in the feedback path of transmitter 200 (e.g., between summers 210 and 215 and mixers 260 and 266). In this implementation, rotator 230 rotates feedback signal 202 instead of intermediate signal 209. Alternatively, in one implementation, rotator 230 can be placed anywhere in the baseband signal path to the right of or below summers 210 and 215.

A mixer 240 mixes in-phase component 232 of rotated signal 211 with a first in-phase local-oscillator signal 236 and a mixer 245 mixes quadrature component 234 of rotated signal 211 with a first quadrature local-oscillator signal 238 to produce a modulated signal 247.

Modulated signal 247 is amplified by a power amplifier 250 and is transmitted via antenna 255. A mixer 260 receives a modulated signal 258 that corresponds to the signal transmitted via antenna 255. Mixer 260 mixes modulated signal 258 with a second in-phase local-oscillator signal 262 to produce in-phase component 204 of the feedback signal 202. A mixer 265 also receives modulated signal 258 and mixes modulated signal 258 with a second quadrature local-oscillator signal 266 to produce quadrature component 212 of feedback signal 202. Feedback signal 202 typically has a different phase than intermediate signal 209 because of, for example, delays in the signal path (e.g., the signal path between the outputs of mixers 240 and 245 and the inputs of mixers 260 and 265) or a phase difference between the local-oscillator signals (i.e., first local-oscillator signals 236 and 238) provided to mixers 240 and 245 and the local-oscillator signals (i.e., second local-oscillator signals 262 and 266) provided to mixers 260 and 265. All sources of relative rotation between feedback signal 202 and intermediate signal 209 can be modeled (e.g., by the phase $\phi$ in second local-oscillator signals 262 and 266) as being caused by a phase difference between first local-oscillator signals 236 and 238 and second local-oscillator signals 262 and 266. Feedback signal 202 is provided to summers 210 and 215.

Intermediate signal 209 is provided to a quantizer 270 after in-phase component 208 of intermediate signal 209 has been filtered by a filter 220 and quadrature component 216 of intermediate signal 209 has been filtered by a filter 221. Feedback signal 202 is also provided to quantizer 270 after in-phase component 204 of feedback signal 202 has been filtered by a filter 226 and quadrature component 212 of feedback signal 202 has been filtered by a filter 227. Filters 220, 221, 226, and 227 can be any type of filter. For example, filters 220, 221, 226, and 227 can be high-pass, low-pass, or band-pass filters and can filter in the analog domain or in the digital domain. Filters 220, 221, 226, and 227 are not required to be identical filters. In one implementation, one or more of filters 220, 221, 226, and 227 may be removed (i.e., no filtering is performed on intermediate signal 209 and/or feedback signal 202). Quantizer 270 quantizes intermediate signal 209 and feedback signal 202 and provides quantized signal components 272a-d to a combiner 282. In one implementation, quantizer 270 coarsely quantizes intermediate signal 209 and feedback signal 202. In another implementation, quantizer 270 quantizes in-phase component 208 of intermediate signal 209, quadrature component 216 of intermediate signal 209, in-phase component 204 of feedback signal 202, and quadrature component 212 of feedback signal 202 using one bit for each component. In one implementation, quantizer 270 only quantizes the components of intermediate signal 209 or the components of feedback signal 202 and does not quantize the components of the other signal. Quantizer 270 can sample any or all of the components of intermediate signal 209 and of feedback signal 202 in time. In this description, quantized signal components will be indicated by using a "'" symbol. For example, $I'_{IN}$ is the quantized version of $I_{IN}$.

Combiner 282 receives quantized signal components 272a-d and combines quantized signal components 272a-d to produce a rotation estimate 284. Rotation estimate 284 is provided to a filter 286 that filters rotation estimate 284 to produce rotation signal 222. Combiner 282 and filter 286 are included in a rotation estimator 280. When rotation estimator 280 reaches the steady state, rotation signal 222 represents the value of the relative rotation between feedback signal 202 and intermediate signal 209. Quantized signal components 272a-d can be combined using linear or non-linear operations, and can be combined using digital circuitry or analog circuitry. In one implementation, a quantized in-phase component of the intermediate signal 272a ($I'_{IN}$) is multiplied by a quantized quadrature component of the feedback signal 272d ($Q'_{FB}$) to produce a first product ($I'_{IN}Q'_{FB}$). A quantized quadrature component of the intermediate signal 272b ($Q'_{IN}$) is multiplied by a quantized in-phase component of the feedback signal 272c ($I'_{FB}$) to produce a second product ($Q'_{IN}I'_{FB}$), and the second product is subtracted from the first product ($I'_{IN}Q'_{FB} - Q'_{IN}I'_{FB}$) to produce rotation estimate 284. In this implementation, when the average value of the sum-of-products ($I'_{IN}Q'_{FB} - Q'_{IN}I'_{FB}$) is 0, intermediate signal 209 and feedback signal 202 are aligned or are 180 degrees out of phase.

In another implementation, the quantized in-phase component of the intermediate signal 272a and the quantized in-phase component of the feedback signal 272c are multiplied to form a first product ($I'_{IN}I'_{FB}$), the quantized quadrature component of the intermediate signal 272b and the quantized quadrature component of the feedback signal 272d are multiplied to form a second product ($Q'_{IN}Q'_{FB}$). The two products are added ($I'_{IN}I'_{FB} + Q'_{IN}Q'_{FB}$) to produce rotation estimate 284. In this implementation, when the average value of the sum-of-products ($I'_{IN}I'_{FB} + Q'_{IN}Q'_{FB}$) is 0, intermediate signal 209 and feedback signal 202 have a relative rotation of 90 degrees, so when the average value of rotation estimate 284 is 0, one of the signals can be rotated 90 degrees relative to the other signal to align the two signals.

The combinations $I'_{IN}Q'_{FB} - Q'_{IN}I'_{FB}$ and $I'_{IN}I'_{FB} + Q'_{IN}Q'_{FB}$ can be used together in one implementation to produce rotation signal 222, as will be discussed below in the context of FIG. 3. In one implementation, when the combinations $I'_{IN}Q'_{FB} - Q'_{IN}I'_{FB}$ and $I'_{IN}I'_{FB} + Q'_{IN}Q'_{FB}$ are used together and one of the combinations indicates that intermediate signal 209 and feedback signal 202 either are aligned or are 180 degrees out of phase, the other combination can be used to detect whether the signals are aligned or are 180 degrees out of phase. For example, the sign of the other combination can indicate whether the signals are aligned or are 180 degrees out of phase.

In another implementation, filter 286 filters rotation estimate 284 synchronously or asynchronously with an analog or digital filter. For example, filter 286 can low-pass filter rotation estimate 284. Filter 286 can also integrate rotation estimate 284 (e.g., using one-step or two-step integration).

As was discussed above, quantizer 270 can quantize in-phase component 208 of intermediate signal 209, quadrature component 216 of intermediate signal 209, in-phase component 204 of feedback signal 202, and quadrature component 212 of feedback signal 202 using one bit for each component. Using one-bit quantization simplifies the design and manufacture of transmitter 200 by simplifying the circuitry used to combine intermediate signal 209 with feedback signal 202 in combiner 282. One-bit quantization of each of the four signal components yields an instantaneous value of rotation estimate 284 that is accurate to within substantially ±45 degrees of the actual relative rotation. When one-bit quantization is combined with filtering (e.g., using filter 286), however, greater accuracy can be obtained. For example, when all symbols are transmitted with uniform probability and the symbol constellation is symmetric about the real and imaginary axes, individual rotation estimates (e.g., rotation estimates from several clock cycles of a synchronous system) can be filtered (e.g., averaged) to provide a very accurate rotation signal 222. Using one bit to quantize each of the in-phase and quadrature components 204, 208, 212, and 216 of each of the intermediate and feedback signals 209 and 202 in quantizer 270 simplifies the implementation of combiner 282. In one implementation, the components of only one of intermediate signal 209 and feedback signal 202 are quantized, while the other signal is processed in the analog domain. In this implementation, combiner 282 can be implemented more simply than when neither intermediate signal 209 nor feedback signal 202 are quantized (i.e., multiplication of a component from one signal with a component of the other signal will involve multiplying an analog value by ±1 instead of by another analog value).

In one implementation, rotation estimator 280 can quantize rotation signal 222. In another implementation, rotator 230 is not used in transmitter 200, and rotation signal 222 instead controls the phase of second local-oscillator signals 262 and 266, the phase of first local-oscillator signals 236 and 238, or both. By adjusting the phase of second local-oscillator signals 262 and 266 relative to the phase of first local-oscillator signals 236 and 238, feedback signal 202 can be rotated relative to intermediate signal 209.

FIG. 3 shows an implementation of quantizer 270 and rotation estimator 280 from FIG. 2. The in-phase component 208 of the intermediate signal 209 is provided to a comparator 310, and the quadrature component 216 of the intermediate signal 209 is provided to a comparator 314. The in-phase component 204 of the feedback signal 202 is provided to a comparator 316, and the quadrature component 212 of the feedback signal 202 is provided to a comparator 312. In one implementation, comparators 310, 312, 314, and 316 compare their respective input signals to ground and output synchronous one-bit quantized representations of the input signals. The output of comparators 310, 312, 314, and 316 represents the sign of the respective input signal. Hereafter, when the output from comparators 310, 312, 314, or 316 is discussed, a positive output will be referred to as a 1, and a negative output will be referred to as a −1. Quantizer 270 provides quantized signals 272*a*-*d* to rotation estimator 280.

The quantized in-phase component of the intermediate signal 272*a* and the quantized quadrature component of the feedback signal 272*d* are provided to an exclusive-OR (XOR) gate 320. The quantized quadrature component of the intermediate signal 272*b* and the quantized in-phase component of the feedback signal 272*c* are provided to an XOR gate 325. The quantized in-phase component of the intermediate signal 272*a* and the quantized in-phase component of the feedback signal 272*c* are also provided to an XOR gate 350, while the quantized quadrature component of the intermediate signal 272*b* and the quantized quadrature component of the feedback signal 272*d* are provided to an XOR gate 355. XOR gates 320, 325, 350, and 355 perform an exclusive-OR logic operation on their respective input signals. The input signals can have a positive value (1) or a negative value (−1). The output of XOR gates 320, 325, 350, and 355 is the sign-inverted, scaled, and shifted product of the two input signals. For example, when both input signals to an XOR gate are 1 or both are −1, the output of the XOR gate is low (0). When one input signal is −1 and one input signal is 1, the output of the XOR gate is high (1).

The output 322 of XOR gate 320 is received by a counter 330. Counter 330 includes some of the functionality of combiner 282 and filter 286 (FIG. 2). In one implementation, counter 330 is a modulo-N counter. Increasing the value of N increases the amount of time that rotation estimator 280 takes to update rotation signal 222 and causes the phase alignment system to respond more slowly. When the output 322 of XOR gate 320 is high (e.g., $I'_{IN}Q'_{FB}=-1$) and the output 323 of XOR gate 325 is low (e.g., $Q'_{IN}I'_{FB}=1$), counter 330 increments. When the output 322 of XOR gate 320 is low (e.g., $I'_{IN}Q'_{FB}=1$) and the output 323 of XOR gate 325 is high (e.g., $Q'_{IN}I'_{FB}=-1$), counter 330 decrements. When the outputs 322 and 323 of XOR gates 320 and 325 are both high or both low, counter 330 neither increments nor decrements. When counter 330 increments to N, an overflow flag 332 is set and counter 330 is reset to a value between 0 and N (e.g., N/2). When counter 330 decrements beyond 0, an underflow flag 334 is set and counter 330 is reset to the value between 0 and N. The combination of XOR gates 320 and 325 and counter 330 combines the quantized components of the intermediate signal 272*a* and 272*b* and the quantized components of the feedback signal 272*c* and 272*d*, and counter 330 filters the combined signal (e.g., by integrating the combined signal to produce overflow flag 332 and underflow flag 334). The combination of quantizer 270 and rotation estimator 280 provides a nonlinear combination of intermediate signal 209 and feedback signal 202.

A counter 340 increments when counter 330 sets overflow flag 332 and decrements when counter 330 sets underflow flag 334. The number stored in counter 340 corresponds to rotation signal 222, and counter 340 provides rotation signal 222 as an output. Rotation signal 222 is increased or decreased when counter 340 is incremented or decremented. Counter 340 can be preset to a value by asserting a "preset" signal 342 and providing the value on a preset bus 346 either serially or in parallel. Counter 340 can also be frozen at a value by asserting a "freeze" signal 344. While freeze signal 344 is asserted, counter 340 remains at the same value regardless of the states of the inputs other than freeze signal 344.

The outputs 352 and 357 of XOR gates 350 and 355 are provided to an AND gate 360 and an AND gate 365. The inputs of AND gate 360 are both inverting inputs. When the output 352 of XOR gate 350 is high (e.g., $I'_{IN}I'_{FB}=-1$) and the output 357 of XOR gate 355 is also high (e.g., $Q'_{IN}Q'_{FB}=-1$), an output 366 of AND gate 365 is high, and a counter 370 decrements. When the output 352 of XOR gate 350 is low (e.g., $I'_{IN}I'_{FB}=1$) and the output 357 of XOR gate 355 is also low (e.g., $Q'_{IN}Q'_{FB}=1$), an output 362 of AND gate 360 is high, and counter 370 increments. When the output 352 or 357 of one of XOR gates 350 and 355 is high and the output 352 or 357 of the other XOR gate is low, the outputs 362 and 366 of AND gates 360 and 365 are both low and counter 370 neither increments nor decrements. In one implementation, counter 370 is a modulo-M counter. When the counter reaches M, an overflow flag 372 is set and counter 370 is reset to a value between 0 and M (e.g., M/2). Setting overflow flag 372 of counter 370 indicates that transmitter 200 (FIG. 2) and/or rotation estimator 280 is in an undesirable state (e.g., the relative rotation is 180 degrees), and rotation estimator 280 can, for example, be put into a predetermined desirable state. As M is increased, the amount of time that rotation estimator 280 must be in an undesirable state before overflow flag 372 is set increases.

In another implementation, counters 330 and/or 370 are reset at fixed, predetermined intervals instead of resetting and triggering following circuit blocks (e.g., counter 340) based on overflow or underflow events. The value of counter 330 or 370 immediately before resetting determines the action of the following block (e.g., whether counter 340 increments, decrements, or stays the same).

FIG. 4 shows a process 400 for estimating and correcting a relative rotation between a first complex signal and a second complex signal. One or both of the first complex signal and the second complex signal is quantized (step 410). The quantization in step 410 can be coarse. For example, the quantization in step 410 can quantize the in-phase and quadrature components of the first complex signal and/or the second complex signal with one bit per component. When both complex signals are quantized, the quantized signal components can be combined to form a rotation estimate (step 420). When only one of the complex signals is quantized, the quantized signal components can be combined with the non-quantized signal components to form the rotation estimate.

Optionally, the rotation estimate is filtered (step 430). The filtering in step 430 can be performed using, for example, a low-pass filter or an integrator. In one implementation, the rotation estimate is not filtered. In another implementation, the rotation estimate is quantized before or after filtering. The phase of the first complex signal and/or the phase of the second complex signal are adjusted based on the rotation estimate (step 440). The phase of a complex signal can be adjusted, for example, by using a rotator circuit in the signal path of the complex signal or by adjusting the phase of a signal used to modulate the complex signal.

The invention and all of the functional operations described in this specification can be implemented in digital electronic circuitry, or in computer hardware, firmware, software, or in combinations of them.

Method steps of the invention can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit).

The invention has been described in terms of particular embodiments. Other embodiments are within the scope of the following claims. The described apparatus and method can be used in many different types of digital or analog systems. For example, the apparatus or method can be used in any electronic communication system whose complex signal path includes at least two points between which phase alignment is useful for operation.

What is claimed is:

1. A method for estimating a relative rotation between a first complex signal and a second complex signal, the method comprising:
    quantizing a first complex signal to produce a quantized signal;
    combining the quantized signal and an additional signal to produce a combined signal, the additional signal corresponding to a second complex signal; and
    generating an estimate of a relative rotation between the first complex signal and the second complex signal in accordance with the combined signal; wherein:
    the first complex signal includes a first in-phase component and a first quadrature component, and the second complex signal includes a second in-phase component and a second quadrature component;
    quantizing the first complex signal includes quantizing the first in-phase component and the first quadrature component; and
    combining includes combining multiplicative products of any of the quantized first in-phase component, the quantized first quadrature component, the second in-phase component, and the second quadrature component.

2. The method of claim 1 further comprising:
    quantizing the second complex signal to produce the additional signal.

3. The method of claim 1 wherein the additional signal is the second complex signal.

4. The method of claim 1 wherein generating an estimate includes filtering the combined signal.

5. The method of claim 4 wherein filtering the combined signal includes digitally filtering the combined signal.

6. The method of claim 5 wherein digitally filtering includes integrating.

7. The method of claim 4 wherein filtering the combined signal includes analog filtering of the combined signal.

8. The method of claim 4 wherein filtering the combined signal includes low-pass filtering of the combined signal.

9. The method of claim 8 wherein low-pass filtering includes integrating.

10. The method of claim 4 wherein filtering includes setting a filter to a predetermined state.

11. The method of claim 1, further comprising:
    quantizing the second in-phase component and the second quadrature component, wherein combining includes combining multiplicative products of any of the quantized first in-phase component, the quantized first quadrature component, the quantized second in-phase component, and the quantized second quadrature component.

12. The method of claim 1 wherein combining includes summing.

13. The method of claim 1 wherein combining includes differencing.

14. The method of claim 1 wherein quantizing includes multi-bit quantizing.

15. The method of claim 1 wherein quantizing includes one-bit quantizing.

16. The method of claim 15 wherein the first complex signal includes a first in-phase component and a first quadrature component, and one-bit quantizing includes quantizing any of the first in-phase component and the first quadrature component using one bit per component.

17. The method of claim 1 wherein at least one of the first complex signal and the second complex signal is a continuous-time signal.

18. The method of claim 1 wherein at least one of the first complex signal and the second complex signal is a discrete-time signal.

19. The method of claim 1 further comprising:
    sampling at least one of the first complex signal and the second complex signal in time.

20. The method of claim 1 further comprising:
    quantizing the estimate of the relative rotation between the first complex signal and the second complex signal.

21. The method of claim 1 wherein combining includes digitally combining.

22. The method of claim 1 further comprising:
    filtering at least one of the first complex signal and the second complex signal.

23. The method of claim 22 wherein filtering includes high-pass filtering.

24. The method of claim 22 wherein filtering includes low-pass filtering.

25. The method of claim 22 wherein filtering includes band-pass filtering.

26. A method for estimating a relative rotation between a first complex signal and a second complex signal, the method comprising:
   quantizing a first complex signal to produce a quantized signal;
   combining the quantized signal and an additional signal to produce a combined signal, the additional signal corresponding to a second complex signal; and
   generating an estimate of a relative rotation between the first complex signal and the second complex signal in accordance with the combined signal; wherein
   the first complex signal and the second complex signal are substantially identical except for the relative rotation.

27. A method for estimating a relative rotation between a first complex signal and a second complex signal, the method comprising:
   quantizing a first complex signal to produce a quantized signal;
   combining the quantized signal and an additional signal to produce a combined signal, the additional signal corresponding to a second complex signal; and
   generating an estimate of a relative rotation between the first complex signal and the second complex signal in accordance with the combined signal;
   rotating at least one of the first complex signal and the second complex signal in accordance with the estimate of the relative rotation between the first complex signal and the second complex signal.

28. The method of claim 27 wherein rotating includes shifting the phase of the at least one of the first complex signal and the second complex signal.

29. The method of claim 27 wherein the first complex signal includes a first in-phase component and a first quadrature component, the second complex signal includes a second in-phase component and a second quadrature component, and rotating includes producing a weighted sum of any of the first in-phase component, the first quadrature component, the second in-phase component, and the second quadrature component.

30. A method for estimating a relative rotation between a first complex signal and a second complex signal, the method comprising:
   quantizing a first complex signal to produce a quantized signal;
   combining the quantized signal and an additional signal to produce a combined signal, the additional signal corresponding to a second complex signal; and
   generating an estimate of a relative rotation between the first complex signal and the second complex signal in accordance with the combined signal;
   wherein combining includes an analog combination.

31. A rotation-estimation circuit, comprising:
   a quantizer operable to receive a first complex signal and produce a quantized signal;
   a combiner operable to receive the quantized signal and an additional signal and produce a combined signal, the additional signal corresponding to a second complex signal; and
   an estimate generator operable to receive the combined signal and produce an estimate of a relative rotation between the first complex signal and the second complex signal; wherein
   the first complex signal includes a first in-phase component and a first quadrature component, and the second complex signal includes a second in-phase component and a second quadrature component;
   the quantizer is operable to produce a quantized first in-phase component and a quantized first quadrature component; and
   the combiner is operable to combine multiplicative products of any of the quantized first in-phase component, the quantized first quadrature component, the second in-phase component, and the second quadrature component to produce the combined signal.

32. The rotation-estimation circuit of claim 31 wherein the quantizer is further operable to receive the second complex signal and produce the additional signal.

33. The rotation-estimation circuit of claim 31 wherein the additional signal is the second complex signal.

34. The rotation-estimation circuit of claim 31 wherein the estimate generator includes a filter.

35. The rotation-estimation circuit of claim 34 wherein the filter includes an integrator.

36. The rotation-estimation circuit of claim 34 wherein the filter includes a low-pass filter.

37. The rotation-estimation circuit of claim 31 wherein the first complex signal and the second complex signal are substantially identical except for the relative rotation.

38. The rotation-estimation circuit of claim 31, wherein:
   the first complex signal includes a first in-phase component and a first quadrature component, and the second complex signal includes a second in-phase component and a second quadrature component;
   the quantizer is operable to produce a quantized first in-phase component, a quantized first quadrature component, a quantized second in-phase component, and a quantized second quadrature component; and
   the combiner is operable to combine multiplicative products of any of the quantized first in-phase component, the quantized first quadrature component, the quantized second in-phase component, and the quantized second quadrature component to produce the combined signal.

39. The rotation-estimation circuit of claim 31 wherein the combiner includes a summer.

40. The rotation-estimation circuit of claim 31 wherein the quantizer includes a one-bit quantizer.

41. The rotation-estimation circuit of claim 40 wherein the one-bit quantizer includes a comparator.

42. The rotation-estimation circuit of claim 40 wherein the first complex signal includes a first in-phase component and a first quadrature component, and the one-bit quantizer is operable to produce a quantized first in-phase component and a quantized first quadrature component.

43. The rotation-estimation circuit of claim 31 further comprising:
   a sampler operable to sample at least one of the first complex signal and the second complex signal in time.

44. The rotation-estimation circuit of claim 31 further comprising:
   a rotator operable to receive the estimate of the relative rotation and rotate at least one of the first complex signal and the second complex signal.

45. The rotation-estimation circuit of claim 44 wherein the first complex signal includes a first in-phase component and a first quadrature component, the second complex signal includes a second in-phase component and a second quadrature component, and the rotator is operable to produce a weighted sum of any of the first in-phase component, the first quadrature component, the second in-phase component, and the second quadrature component.

46. The rotation-estimation circuit of claim 31 further comprising:
a quantizer operable to receive the estimate of the relative rotation and produce a quantized estimate.

47. The rotation-estimation circuit of claim 31 further comprising:
a filter operable to receive at least one of the first complex signal and the second complex signal and produce a filtered signal.

48. A wireless transmitter operable to transmit a complex input signal, the wireless transmitter comprising:
a rotator operable to receive a first complex signal and adjust a phase of the first complex signal relative to a phase of a second complex signal to produce an adjusted signal, the rotator adjusting the phase of the first complex signal responsive to an estimate of a relative rotation between the first complex signal and the second complex signal; and
a rotation-estimation circuit, the rotation-estimation circuit including,
a quantizer operable to receive the first complex signal and produce a quantized signal;
a combiner operable to receive the quantized signal and an additional signal and produce a combined signal, the additional signal corresponding to the second complex signal; and
an estimate generator operable to receive the combined signal and produce the estimate of the relative rotation between the first complex signal and the second complex signal.

49. The wireless transmitter of claim 48 comprising:
a first mixer operable to mix the adjusted signal with a first local-oscillator signal to produce a modulated signal;
a second mixer operable to mix the modulated signal with a second local-oscillator signal to produce the second complex signal; and
a summer operable to combine the second complex signal and a complex input signal to produce the first complex signal.

50. The wireless transmitter of claim 48 comprising:
a filter operable to provide a gain to any of the first complex signal and the second complex signal.

51. The wireless transmitter of claim 48 wherein the rotator includes a mixer operable to mix the first complex signal with a local-oscillator signal to produce the adjusted signal, the rotator being operable to adjust a phase of the local-oscillator signal responsive to the estimate of the relative rotation between the first complex signal and the second complex signal.

52. The wireless transmitter of claim 48 wherein the quantizer is further operable to receive the second complex signal and produce the additional signal.

53. The wireless transmitter of claim 48 wherein the additional signal is the second complex signal.

54. The wireless transmitter of claim 48 wherein the estimate generator includes a filter.

55. The wireless transmitter of claim 48 wherein the first complex signal and the second complex signal are substantially identical except for the relative rotation.

56. The wireless transmitter of claim 48 wherein:
the first complex signal includes a first in-phase component and a first quadrature component, and the second complex signal includes a second in-phase component and a second quadrature component;
the quantizer is operable to produce a quantized first in-phase component and a quantized first quadrature component; and
the combiner is operable to combine multiplicative products of any of the quantized first in-phase component, the quantized first quadrature component, the second in-phase component, and the second quadrature component to produce the combined signal.

57. The wireless transmitter of claim 48 wherein:
the first complex signal includes a first in-phase component and a first quadrature component, and the second complex signal includes a second in-phase component and a second quadrature component;
the quantizer is operable to produce a quantized first in-phase component, a quantized first quadrature component, a quantized second in-phase component, and a quantized second quadrature component; and
the combiner is operable to combine multiplicative products of any of the quantized first in-phase component, the quantized first quadrature component, the quantized second in-phase component, and the quantized second quadrature component to produce the combined signal.

58. The wireless transmitter of claim 48 wherein the quantizer includes a one-bit quantizer.

59. The wireless transmitter of claim 58 wherein the one-bit quantizer includes a comparator.

60. The wireless transmitter of claim 58 wherein the first complex signal includes a first in-phase component and a first quadrature component, and the one-bit quantizer is operable to produce a quantized first in-phase component and a quantized first quadrature component.

61. The wireless transmitter of claim 48 wherein the first complex signal includes a first in-phase component and a first quadrature component, the second complex signal includes a second in-phase component and a second quadrature component, and the rotator is operable to produce a weighted sum of any of the first in-phase component, the first quadrature component, the second in-phase component, and the second quadrature component.

* * * * *